(12) United States Patent
Zhou et al.

(10) Patent No.: US 10,679,917 B2
(45) Date of Patent: Jun. 9, 2020

(54) CHIP PACKAGE STRUCTURE, TERMINAL DEVICE, AND METHOD

(71) Applicant: Guangdong Oppo Mobile Telecommunications Corp., Ltd., Dongguan, Guangdong (CN)

(72) Inventors: Yibao Zhou, Guangdong (CN); Wenzhen Zhang, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 16/438,918

(22) Filed: Jun. 12, 2019

(65) Prior Publication Data

US 2019/0295916 A1 Sep. 26, 2019

Related U.S. Application Data

(63) Continuation of application No. 16/079,459, filed as application No. PCT/CN2017/079593 on Apr. 6, 2017.

(30) Foreign Application Priority Data

Apr. 8, 2016 (CN) .......................... 2016 1 0219333

(51) Int. Cl.
*H01L 23/31* (2006.01)
*H01L 23/00* (2006.01)
(Continued)

(52) U.S. Cl.
CPC ...... *H01L 23/3185* (2013.01); *G06K 9/00006* (2013.01); *H01L 21/56* (2013.01);
(Continued)

(58) Field of Classification Search
CPC .......................... H01L 24/32; H01L 23/3185
See application file for complete search history.

(56) References Cited

U.S. PATENT DOCUMENTS

| 6,195,142 | B1 | 2/2001 | Gyotoku et al. |
| 10,304,767 | B2 | 5/2019 | Kobayashi |

(Continued)

FOREIGN PATENT DOCUMENTS

| CN | 101026131 A | 8/2007 |
| CN | 101123284 A | 2/2008 |

(Continued)

OTHER PUBLICATIONS

Extended European search report issued in corresponding European application No. 17778671.2 dated Jan. 2, 2019.
(Continued)

*Primary Examiner* — Moazzam Hossain
(74) *Attorney, Agent, or Firm* — Young Basile Hanlon & MacFarlane, P.C.

(57) ABSTRACT

A chip package apparatus is provided. The chip package apparatus includes a substrate, a chip on the substrate, and a filling layer on the substrate and surrounding a portion of the chip. The filling layer is made of epoxy molding compound (EMC) and the EMC is white. An electronic device with the chip package apparatus and a method for manufacturing the chip package apparatus are provided.

16 Claims, 2 Drawing Sheets

(51) Int. Cl.
*H01L 21/56* (2006.01)
*H01L 23/29* (2006.01)
*H01L 23/488* (2006.01)
*G06K 9/00* (2006.01)
*H01L 27/146* (2006.01)

(52) U.S. Cl.
CPC ............ *H01L 23/29* (2013.01); *H01L 23/488* (2013.01); *H01L 24/16* (2013.01); *H01L 24/32* (2013.01); *H01L 24/48* (2013.01); *H01L 23/562* (2013.01); *H01L 27/14678* (2013.01); *H01L 2224/12105* (2013.01); *H01L 2224/1601* (2013.01); *H01L 2224/16225* (2013.01); *H01L 2224/18* (2013.01); *H01L 2224/32225* (2013.01); *H01L 2224/45144* (2013.01); *H01L 2224/48225* (2013.01)

(56) References Cited

U.S. PATENT DOCUMENTS

| | | | |
|---|---|---|---|
| 2002/0121705 | A1 | 9/2002 | Pu et al. |
| 2006/0012016 | A1* | 1/2006 | Betz ...................... H01L 23/047 257/678 |
| 2007/0194464 | A1* | 8/2007 | Fukuzono ............. H01L 21/563 257/791 |
| 2010/0090333 | A1* | 4/2010 | Hayashi ............ H01L 23/49838 257/693 |
| 2010/0183457 | A1* | 7/2010 | Hattori ................. H01L 23/492 417/410.1 |
| 2010/0230797 | A1* | 9/2010 | Honda .................. H01L 21/563 257/687 |
| 2011/0297933 | A1 | 12/2011 | Jo et al. |
| 2012/0043656 | A1 | 2/2012 | Hayashi |
| 2016/0300988 | A1* | 10/2016 | Oh .......................... H01L 33/60 |
| 2016/0358890 | A1 | 12/2016 | Heinrich et al. |
| 2016/0372619 | A1* | 12/2016 | Dhar ..................... G02B 6/0076 |
| 2017/0117200 | A1* | 4/2017 | Kim ...................... H01L 21/561 |
| 2017/0364726 | A1 | 12/2017 | Buchan et al. |

FOREIGN PATENT DOCUMENTS

| | | |
|---|---|---|
| CN | 103354228 A | 10/2013 |
| CN | 104051367 A | 9/2014 |
| CN | 204242200 U | 4/2015 |
| CN | 204515795 U | 7/2015 |
| CN | 104867919 A | 8/2015 |
| CN | 104882419 A | 9/2015 |
| CN | 105336733 A | 2/2016 |
| CN | 205845930 U | 12/2016 |
| JP | 2002076206 A | 3/2002 |
| JP | 2005223366 A | 8/2005 |

OTHER PUBLICATIONS

"Practical stamping technical manual", Xiaopei Wang, etc. pp. 470-472, China Machine Press, Oct. 31, 2013.

International search report issued in corresponding international application No. PCT/CN2017/079593 dated Jun. 27, 2017.

* cited by examiner

CHIP PACKAGE STRUCTURE, TERMINAL DEVICE, AND METHOD

CROSS-REFERENCE TO RELATED APPLICATION(S)

This application is a continuation of U.S. application Ser. No. 16/079,459, filed on Aug. 23, 2018, which is a national stage application of PCT Patent Application No. PCT/CN2017/079593 filed on Apr. 6, 2017,which claims priority to Chinese Patent Application No. 201610219333.2, filed on Apr. 8, 2016. The contents of the above applications are all incorporated by reference as if fully set forth herein in their entireties.

TECHNICAL FIELD

The present disclosure relates to the technology field of chip package, and more particularly, to a chip package apparatus, an electronic device with the chip package apparatus, and a method for manufacturing the chip package apparatus.

BACKGROUND

Electronic devices have entered the era of surface mount technology (SMT). With the development of miniaturization of electronic devices, the outlines of the SMT components have gradually miniaturized.

With the progress of science and technology, fingerprint recognition has become the standard of smart phones, tablet computers, and other terminal devices. At present, fingerprint unit chips (also known as fingerprint module chips) have a variety of shapes, such as round, square, rectangle and so on. In practical applications, packaging a fingerprint unit chip or other chips needs to consider various factors, such as performance, cost, appearance, and so on. It can be seen that how to provide a chip package apparatus with quick response has become an urgent problem to be solved.

SUMMARY

The technical problem to be solved in the embodiments of the present disclosure is to provide a chip package apparatus with quick response, an electronic device with the chip package apparatus, and a method for manufacturing the chip package apparatus.

In a first aspect, an embodiment of the present disclosure provides a chip package structure. The chip package structure includes a substrate, a chip disposed on the substrate, a number of solder balls, a filling layer disposed on the substrate, and a reinforcement member disposed on the substrate. The chip is coupled with the substrate through the number of solder balls. The number of solder balls are disposed between the substrate and the chip in array. A distance between neighbor rows of the solder balls in array gradually increases toward a direction of a center of the chip package structure and a distance between neighbor columns of the solder balls in array gradually increases toward the direction of the center of the chip package structure. The filling layer surrounds and encapsulates a side of the chip away from the substrate and a sidewall of the chip. The filling layer is made of epoxy molding compound and the epoxy molding compound is white. The reinforcement member surrounds an outside of the filling layer, is located adjacent to the filling layer, and extends beyond an edge of the substrate.

In a second aspect, an embodiment of the present disclosure provides a terminal device. The chip package structure includes a substrate, a chip disposed on the substrate, a number of solder balls, a filling layer disposed on the substrate, and a reinforcement member disposed on the substrate. The chip is coupled with the substrate through the number of solder balls. The number of solder balls are disposed between the substrate and the chip in array. A distance between neighbor rows of the solder balls in array gradually increases toward a direction of a center of the chip package structure and a distance between neighbor columns of the solder balls in array gradually increases toward the direction of the center of the chip package structure. The filling layer surrounds and encapsulates a side of the chip away from the substrate and a sidewall of the chip. The filling layer is made of epoxy molding compound and the epoxy molding compound is white. The reinforcement member surrounds an outside of the filling layer, is located adjacent to the filling layer, and extends beyond an edge of the substrate.

In a third aspect, an embodiment of the present disclosure provides a method for manufacturing a chip package apparatus. The method includes providing a substrate; disposing a chip on the substrate; disposing a number of solder balls in array between the substrate and the chip, a distance between neighbor rows of the plurality of solder balls in array gradually increasing along a direction toward a center of the chip package structure, and a distance between neighbor columns of the plurality of solder balls in array gradually increasing along the direction toward the center of the chip package structure; disposing a filling layer on the substrate, the filling layer surrounding and encapsulating a side of the chip away from the substrate and a sidewall of the chip, and being made of epoxy molding compound, the epoxy molding compound being white; and disposing a reinforcement member on the substrate, the reinforcement member surrounding an outside of the filling layer, being located adjacent to the filling layer, and extending beyond an edge of the substrate.

BRIEF DESCRIPTION OF THE DRAWINGS

To better illustrate the technical solutions of embodiments of the present disclosure or of the prior art, the following descriptions will briefly illustrate the accompanying drawings described in the embodiments or in the prior art. Obviously, the following described accompanying drawings are merely some embodiments of the present disclosure. Those skilled in the art can obtain other accompanying drawings according to the described accompanying drawings without creative efforts.

DETAILED DESCRIPTION

Figure 1:
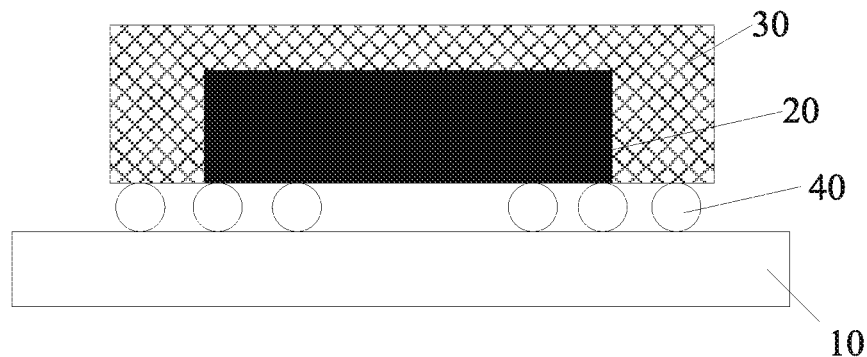
FIG. 1 is a schematic cross-sectional view of a chip package apparatus according to a first embodiment of the present disclosure.

In order to enable those skilled in the art to better understand the solutions of the present disclosure, the technical solutions of embodiments of the present disclosure will be described clearly and completely in combination with the accompanying drawings of the embodiments of the present disclosure. Obviously, the described embodiments are merely a part of embodiments of the present disclosure, but not all of the embodiments. All other embodiments obtained by those skilled in the art without creative efforts based on the embodiments of the present disclosure shall fall within the protection scope of the present disclosure.

Unless defined otherwise, technical or scientific terms used herein should be interpreted as a generic meaning understood by those skilled in the art. Terms "first", "second", "third", "fourth" and so on used in the present disclosure are used to distinguish different objects, rather than describe any specific sequence, quantity, or importance. Similarly, terms such as "a", "an" or "the" do not denote a limitation of quantity, but are used to indicate at least one. Similarly, the term "include" or "comprise" and the like means that the element or object that appears ahead of the word covers the element or object that appears after the word and its equivalent, and does not exclude other elements or objects. The term "couple" or the like is not limited to physical or mechanical connections, but may include electrical connections, whether direct or indirect. The terms "up", "down", "left", "right" and the like are only used to represent relative positional relationships. When the absolute position of the described object is changed, the relative positional relationship may also be changed accordingly.

For clarity, the thickness of layers or regions in the drawings is enlarged rather than according to the actual scale. When an element such as a layer, a film, a region, or a substrate and the like is referred to as being "on" another element, the element may be "directly" on another element or an intervening element may exist.

The "embodiment" mentioned herein means that particular features, structures, or characteristic described with reference to the embodiments may be included in at least one embodiment of the present disclosure. Phrases appearing at various positions of the specification neither always refer to the same embodiment, nor separate or alternative embodiments that are mutually exclusive with other embodiments. It is explicitly and implicitly understood by those skilled in the art that the embodiments described herein may he combined with other embodiments.

FIG. 1 is schematic cross-sectional views of a chip package apparatus according to a first embodiment of the present disclosure. The chip package apparatus includes a substrate 10, a chip 20, a filling layer 30. The chip 20 is disposed on the substrate 10. The filling layer 30 is disposed on the substrate 10 and surrounds and packages a portion of the chip 20. The chips 20 includes a top side away from the substrate 10 and a sidewall surrounding the chip 20. In particular, the filling layer 30 surrounds and encapsulates the top side of the chip 20 away from the substrate 10. The filling layer 30 further surrounds and encapsulates the sidewall of the chip 20. The material of the filling layer 30 is epoxy molding compound (EMC) and the EMC is white. It can be seen that as the filling layer 30 is white, when the chip package apparatus is applied to an electronic device with a white panel glass, a surface cover of the chip (such as a fingerprint chip or other chips) need not be provided with an ink layer. This may omit a process and reduce the cost. In addition, as the thickness of the ink layer is reduced, a distance from the finger to the chip becomes shorter, and the entire response of capacitors and the strength of signals become stronger. The electronic device may obtain information with better quality. It is beneficial to enhance the response speed of the electronic device.

Therein, the substrate 10 may include a dielectric material, such as organic material. The organic material may be at least one of polypropylene (PP), epoxy resin, polyimide. The filling layer 30 may prevent the chip 20 from being damaged and/or being contaminated. The chip 20 is a fingerprint unit chip (also known as fingerprint module chip). Of course, the chip 20 may be other chips.

In at least one implementation, the chip package apparatus may further include another substrate. The substrate may be, such as but not limited to, a print circuit board. The substrate 10 and the chip 20 may be disposed on a top surface of another substrate. In one embodiment, a thickness of the substrate 10 may be less than that of another substrate.

In at least one implementation, the chip package apparatus may further include a conductive member. The conductive member is disposed between another substrate and the chip 20. Electrical signals may be transferred between another substrate and the chip 20 through the conductive member.

In at least one implementation, the chip 20 is coupled with the substrate 10 through solder balls 40. The solder balls 40 are disposed on the substrate 10 in an array (also known as arrayed solder balls) and between the chip and the substrate 10.

In at least one implementation, each solder ball 40 has a diameter ranging from 0.22 mm to 0.3 mm.

In at least one implementation, the distance between neighbor solder balls 40 ranges from 0.46 mm to 0.55 mm.

Therein, the distance between neighbor solder balls 40 may be equal or not equal. For example, the distance between the outmost row of the arrayed solder balls and the secondary outmost row of the arrayed solder balls is less than that between other neighbor rows of the solder balls, and the distance between the outmost column of the arrayed solder balls and the secondary outmost column of the arrayed solder balls is less than that between other neighbor columns of the solder balls. For example, the distance between neighbor rows of the solder balls in array gradually increases along a direction towards or away from a center of the chip package apparatus, and the distance between neighbor columns of the solder balls in array gradually increases along the direction of the center towards or away from the chip package apparatus, and so on, which is not limited in the present disclosure.

Figure 2:
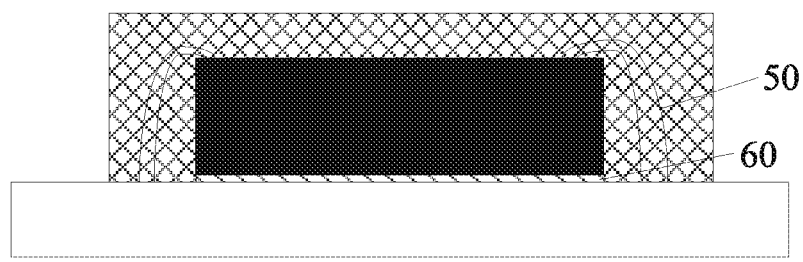
FIG. 2 is a schematic cross-sectional view of a chip package apparatus according to a second embodiment of the present disclosure.

FIG. 2 is a schematic cross-sectional view of a chip package apparatus according to a second embodiment of the present disclosure. The chip package apparatus of the second embodiment is similar to the chip package apparatus of the first embodiment except that the chip 20 is adhesively coupled with (also known as adhesively bonded to) the substrate 10 through transparent optical adhesive 60 and conductive wires 50. The conductive wires 50 may be selected from a group consisting of gold wires, silver wires, and copper wires.

Therein, in the structure of the chip 20 coupled with the substrate 10 through conductive wires 50, in order to enhance the reliability and the structural stability of the chip package apparatus, the substrate 10 and the chip 20 are adhesively coupled through the transparent optical adhesive 60. Of course, the optical adhesive 60 may be replaced by other glues with the functions of adhesive bonding, which is not limited in the present disclosure.

Figure 3:
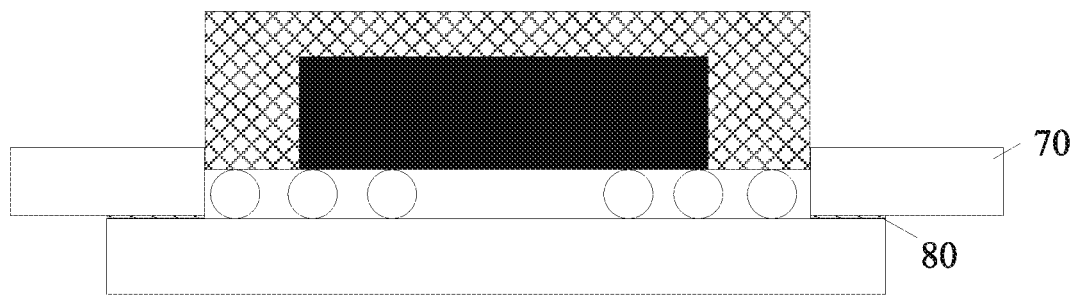
FIG. 3 is a schematic cross-sectional view of a chip package apparatus according to a third embodiment of the present disclosure.

FIG. 3 is a schematic cross-sectional view of a chip package apparatus according to a third embodiment of the present disclosure. The chip package apparatus of the third embodiment is similar to the chip package apparatus of the first embodiment except that a reinforcement member 70 is adhesively coupled with the substrate 10 through transparent optical adhesive 80.

In at least one implementation, the reinforcement member 70 has a higher thermal conductivity than the substrate 10.

In at least one implementation, the reinforcement member 70 extends beyond an edge of the substrate 10. The reinforcement member 70 surrounds an outside of the filling layer 30. The reinforcement member 70 is located adjacent to the filling layer 30.

Therein, based on the demand for lightness, thinness, and integration of electronic devices, the size of the chip package apparatus has been continuously reduced. The thickness of the substrate 10 is reduced accordingly. For example, the thickness of the substrate 10 may range from 100 μm~200 μm, or range from 20 μm~80 μm. As the thickness of the substrate 10 is reduced, the structural strength of the substrate 10 is accordingly decreased. The substrate 10 supporting the chip 20 may exist a problem of the warpage such that the step of disposing the substrate on other electronic components is difficult to be implemented. Therefore, the reliability and the structural stability of the chip package apparatus are insufficient. To enhance the reliability and the structural stability of the chip package apparatus, the reinforcement member 70 is disposed on the substrate 10 to avoid the warpage of the substrate 10. In addition, the reinforcement member 70 has a higher thermal conductivity than the substrate 10. In this way, not only the reliability and the structural stability of the chip package apparatus are reinforced, but also the heat dissipation of the chip 20 during operation is improved. The reinforcement member 70 may include, but not limited to, stainless steel, copper, aluminum, gold, silver, alloys of different metal material, or combinations of the foregoing. In order to enhance the adhesively coupling between the reinforcement member 70 and the substrate 10, the reinforcement member 70 and the substrate 10 may be adhesively coupled through the transparent optical adhesive 80. Of course, the transparent optical adhesive 80 may be replaced by other glues, which is not limited in the present disclosure.

Figure 4:
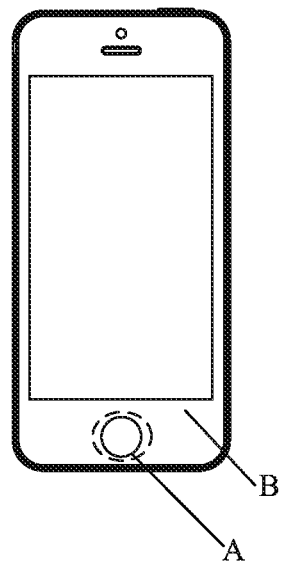
FIG. 4 is a schematic view of an electronic device with a chip package apparatus according to an embodiment of the present disclosure.

FIG. 4 is a schematic structural view of an electronic device according to an embodiment of the present disclosure. In FIG. 4, "A" denotes the chip package apparatus illustrated in FIGS. 1 to 3 and "B" denotes a white panel glass. The chip package apparatus may be attached to the white panel glass, for example, the chip package apparatus may be disposed below the white panel glass or in an opening of the white panel glass. In the embodiment, the chip package apparatus may be disposed in the opening of the white panel glass. The chip package apparatus includes a substrate 10, a chip 20, a filling layer 30. The chip 20 is disposed on the substrate 10. The filling layer 30 is disposed on the substrate 10 and surrounds a portion of the chip 20. The material of the filling layer 30 is epoxy molding compound (EMC) and the EMC is white.

Therein, "mobile terminal" or "terminal device" referred in the embodiments of the present disclosure is also referred to user equipment (UE), which is a kind of device providing voice and/or data communication to the user, such as hand-held devices having wireless communication functions, in-vehicle devices, and so on. The common electronic device, such as, includes, mobile phones, tablet computers, notebook computers, palm computers, mobile internet devices (MIDs), wearable devices, such as smart watches, and smart wristbands.

In at least one implementation, the chip 20 is coupled with the substrate through solder balls 40. The solder balls 40 are disposed on the substrate 10 in the array.

In at least one implementation, each the solder ball 40 has a diameter ranging from 0.22 mm to 0.3 mm.

In at least one implementation, a distance between neighbor solder balls 40 ranges from 0.46 mm to 0.55 mm.

In at least one implementation, the chip 20 is coupled with the substrate 10 through conductive wires 50, such as gold wires, silver wires, copper wires, and so on.

In at least one implementation, the chip 20 and the substrate 10 are adhesively coupled through transparent optical adhesive 60.

In at least one implementation, the chip package apparatus further includes a reinforcement member 70 disposed on the substrate 10.

In at least one implementation, the reinforcement member 70 has a higher thermal conductivity than the substrate 10.

In at least one implementation, the substrate 10 and the reinforcement member 70 are adhesively coupled through transparent optical adhesive 80.

In at least one implementation, the reinforcement member 70 extends beyond an edge of the substrate 10, The reinforcement member 70 surrounds an outside of the filling layer 30. The reinforcement member 70 is located adjacent to the filling layer 30.

It can be seen that in the embodiment, when the chip apparatus structure is applied to the electronic device with the white panel glass and the filling layer 30 is white, a surface cover of the chip (such as fingerprint chips or other chips) need not be provided with an ink layer. This may omit a process and reduce the cost. In addition, as the thickness of the ink layer is reduced, a distance from the finger to the chip becomes shorter, and the entire response of capacitors and the strength of signals become stronger. The electronic device may obtain information with better quality. It is beneficial to enhance the response speed of the electronic device.

Figure 5:
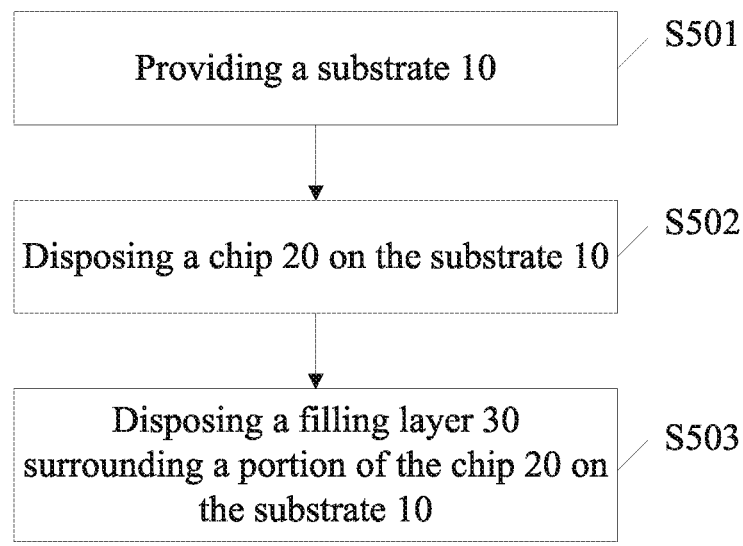
FIG. 5 is a flow chart of a method for manufacturing a chip package apparatus according to an embodiment of the present disclosure.

FIG. 5 is a flow chart of a method for manufacturing a chip package apparatus according to an embodiment of the present disclosure. The method in the embodiment of the present disclosure may include the operations at blocks illustrated in FIG. 5.

At block 501, a substrate 10 is provided.

At block 502, a chip 20 is disposed on the substrate 10.

At block 503, a filling layer 30 is disposed on the substrate 10 and surrounds a portion of the chip 20. The chips 20 includes a top side away from the substrate 10 and a sidewall surrounding the chip 20. In particular, the filling layer 30 surrounds and encapsulates the top side of the chip 20 away from the substrate 10. The filling layer 30 further surrounds and encapsulates the sidewall of the chip 20. The filling layer 30 is made of epoxy molding compound (EMC) and the EMC is white.

In at least one implementation, solder balls 40 are disposed on the substrate 10 in the array to enable the chip 20 to be coupled with the substrate 10 through the solder balls 40. For example, the distance between neighbor rows of the solder balls in array gradually increases along a direction towards or away from a center of the chip package apparatus, and the distance between neighbor columns of the solder balls in array gradually increases along the direction of the center towards or away from the chip package apparatus.

In at least one implementation, conductive wires 50 are disposed between the substrate 10 and the chip 20 to enable the chip 20 to be coupled with the substrate 10 through the conductive wires 50. The conductive wires 50 may be selected from a group consisting of gold wires, silver wires, and copper wires.

In at least one implementation, in the structure of the chip 20 coupled with the substrate 10 through conductive wires 50, in order to enhance the reliability and the structural stability of the chip package apparatus, a transparent optical adhesive 60 is disposed between the substrate 10 and the chip 20 to adhesively couple the chip 20 and the substrate 10.

In at least one implementation, each solder ball 40 has a diameter ranging from 0.22 mm to 0.3 mm.

In at least one implementation, a distance between neighbor solder balls 40 ranges from 0.46 mm to 0.55 mm.

In at least one implementation, in order to enhance the reliability and the structural stability of the chip package apparatus, a reinforcement member 70 is disposed on the substrate 10 to avoid the warpage of the substrate 10. The reinforcement member 70 surrounds an outside of the filling layer 30, is located adjacent to the filling layer 30, and extends beyond an edge of the substrate 10.

In at least one implementation, in order to enhance heat dissipation of the chip 20 during operation, the thermal conductivity of reinforcement member 70 is set to be greater than that of the substrate 10.

In at least one implementation, in order to enhance the adhesive coupling between the substrate 10 and the reinforcement member 70, a transparent optical adhesive 80 is disposed between the substrate 10 and the reinforcement member 70 to adhesively couple the reinforcement member 70 and the substrate 10.

It can be seen that as the filling layer 30 is white, when the chip package apparatus is applied to an electronic device with a white panel glass, a surface cover of the chip (such as a fingerprint chip or other chips) need not to be provided with an ink layer. This may omit a process and reduce the cost. In addition, as the thickness of the ink layer is reduced, a distance from the finger to the chip becomes shorter, and the entire response of capacitors and the strength of signals become stronger. The electronic device may obtain information with better quality. It is beneficial to enhance the response speed of the electronic device.

The above embodiments are only used to illustrate the technical solution of the present disclosure rather than to limit the present disclosure. Referring to the foregoing embodiments, the present disclosure is described in detail, the skilled in art should understand that the technical solution recited in the foregoing embodiments may be modified or some technical features may be replaced equivalently, those modifications or replacements will not make the essence of the corresponding technical solutions deviate from the scope of the technical solutions of the embodiments of the present disclosure.

What is claimed is:

1. A chip package structure, comprising:
   a substrate;
   a chip disposed on the substrate;
   a plurality of solder balls, the chip being coupled with the substrate through the plurality of solder balls, the plurality of solder balls being disposed between the substrate and the chip in array, a distance between neighbor rows of the solder balls in array gradually increasing along a direction toward a center of the chip package structure, and a distance between neighbor columns of the solder balls in array gradually increasing along the direction toward the center of the chip package structure;
   a filling layer disposed on the substrate, the filling layer surrounding and encapsulating a side of the chip away from the substrate and a sidewall of the chip, and being made of epoxy molding compound, the epoxy molding compound being white; and
   a reinforcement member disposed on the substrate, the reinforcement member surrounding an outside of the filling layer, being located adjacent to the filling layer, and extending beyond an edge of the substrate to avoid warpage of the substrate.

2. The chip package structure of claim 1, wherein each of the plurality of solder balls has a diameter ranging from 0.22 mm to 0.3 mm and/or a distance between neighbor solder balls ranges from 0.46 mm to 0.55 mm.

3. The chip package structure of claim 1, wherein the reinforcement member has a higher thermal conductivity than the substrate.

4. The chip package structure of claim 1, wherein the substrate and the reinforcement member are adhesively coupled through transparent optical adhesive.

5. The chip package structure of claim 3, wherein the substrate and the reinforcement member are adhesively coupled through transparent optical adhesive.

6. The chip package structure of claim 1, wherein the chip is a fingerprint chip, and a surface cover covering the chip is not provided with an ink layer on the surface cover when the chip package apparatus is applied to an electronic device with a white panel glass.

7. The chip package structure of claim 1, wherein the chip is a fingerprint chip, and a surface cover covering the chip does not require an ink layer disposed on the surface cover when the chip package apparatus is applied to an electronic device with a panel glass with the same color as that of the filling layer.

8. The chip package structure of claim 1, wherein the reinforcement member surrounds a lower portion of the outside of the filling layer.

9. A terminal device, comprising a chip package structure, the chip package structure comprising:
   a substrate;
   a chip disposed on the substrate;
   a plurality of solder balls, the chip being coupled with the substrate through the plurality of solder balls, the plurality of solder balls being disposed between the substrate and the chip in array, a distance between neighbor rows of the solder balls in array gradually increasing along a direction toward a center of the chip package structure, and a distance between neighbor columns of the solder balls in array gradually increasing along the direction toward the center of the chip package structure;
   a filling layer disposed on the substrate, the filling layer surrounding and encapsulating a side of the chip away from the substrate and a sidewall of the chip, and being made of epoxy molding compound, the epoxy molding compound being white; and
   a reinforcement member disposed on the substrate, the reinforcement member surrounding an outside of the filling layer, being located adjacent to the filling layer, and extending beyond an edge of the substrate to avoid warpage of the substrate.

10. The terminal device of claim 9, wherein each of the plurality of solder balls has a diameter ranging from 0.22 mm to 0.3 mm and/or a distance between neighbor solder balls ranges from 0.46 mm to 0.55 mm.

11. The terminal device of claim 9, wherein the reinforcement member has a higher thermal conductivity than the substrate.

12. The terminal device of claim 9, wherein the substrate and the reinforcement member are adhesively coupled through transparent optical adhesive.

13. The terminal device of claim 11, wherein the substrate and the reinforcement member are adhesively coupled through transparent optical adhesive.

14. The terminal device of claim 9, wherein the chip is a fingerprint chip, and a surface cover covering the chip is not provided with an ink layer on the surface cover when the chip package apparatus is applied to an electronic device with a white panel glass.

15. The terminal device of claim 9, wherein the chip is a fingerprint chip, and a surface cover covering the chip does not require an ink layer disposed on the surface cover when the chip package apparatus is applied to an electronic device with a panel glass with the same color as that of the filling layer.

16. The terminal device of claim 9, wherein the reinforcement member surrounds a lower portion of the outside of the filling layer.

* * * * *